United States Patent

Kawanabe et al.

Patent Number: 6,133,557
Date of Patent: *Oct. 17, 2000

[54] WAFER HOLDING MEMBER

[75] Inventors: Yasunori Kawanabe; Kazuhiro Kuchimachi; Hironori Inoue; Saburo Nagano, all of Kokubu, Japan

[73] Assignee: Kyocera Corporation, Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/594,244

[22] Filed: Jan. 30, 1996

[30] Foreign Application Priority Data

Jan. 31, 1995 [JP] Japan ................................. 7-014820
Feb. 28, 1995 [JP] Japan ................................. 7-041024
Mar. 30, 1995 [JP] Japan ................................. 7-074081

[51] Int. Cl.$^7$ ............................... H05B 3/44; H01B 1/06; C04B 35/10
[52] U.S. Cl. ......................... 219/544; 252/508; 501/153
[58] Field of Search ..................... 219/544, 543, 219/542, 552, 553; 338/307, 308; 501/153, 154; 252/508, 512, 516

[56] References Cited

U.S. PATENT DOCUMENTS

| | | | |
|---|---|---|---|
| 5,264,681 | 11/1993 | Nozaki et al. ........................... | 219/544 |
| 5,280,156 | 1/1994 | Niori et al. ............................... | 219/385 |
| 5,306,895 | 4/1994 | Ushikoshi et al. ...................... | 219/385 |
| 5,366,585 | 11/1994 | Robertson et al. ...................... | 156/643 |
| 5,560,851 | 10/1996 | Thimm et al. ........................... | 219/543 |
| 5,683,606 | 11/1997 | Ushikoshi et al. ...................... | 219/544 |
| 5,985,035 | 11/1999 | Tamura et al. ........................... | 118/724 |

Primary Examiner—Sam Paik
Attorney, Agent, or Firm—Hogan & Hartson LLP

[57] ABSTRACT

A wafer holding member comprises a ceramic base body and a heating resistor, an electrostatic adhesion electrode or a plasma generation electrode embedded in the base body. The wafer holding member exhibits reduced thermal expansion and greater corrosion resistance against halogenic gases. The heating resistor is made of a mixture containing 90 to 99 wt % of at least one of W, Mo, WC, TiC and TiN (the first component), and 1 to 10 wt % of AlN (the second component), the electrostatic adhesion electrode is made of a mixture containing 50 to 99 wt % of said first component, and 1 to 50 wt % of said second component, and the plasma generation electrode is made of a mixture containing 80 to 99 wt % of said first component, and 1 to 20 wt % of said second component. When heating resistors are used, the ceramic base body can include a plurality of heating resistors embedded in the base body and energized successively, with the ratio of the resistance value of the heating resistor numbered m to the resistance value of the heating resistor numbered m-1 is in a range of 1.5 to 4. The ceramic holding member can comprise a corrosion-resistant member made of an aluminum nitride based sintered body and more particularly, at least the mounting surface that holds the wafer is made of 99 wt % or more AlN and 1500 ppm or less of silicon.

20 Claims, 5 Drawing Sheets

F I G. 3 (A)
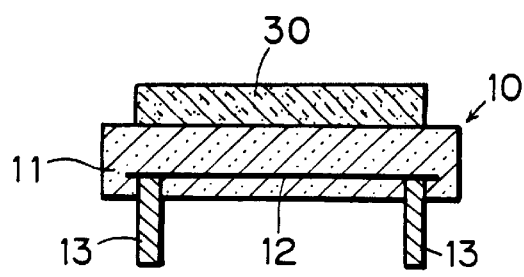
F I G. 3 (B)
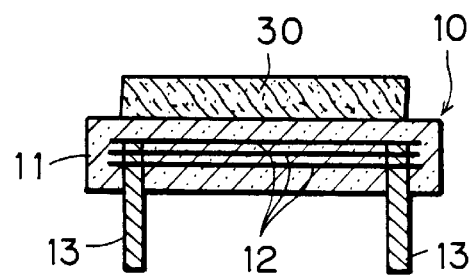

WAFER HOLDING MEMBER

BACKGROUND OF THE INVENTION

1. Field of the Invention

The present invention relates to the improvements in a wafer holding member generally made of an aluminum nitride based sintered body, for example, a susceptor for holding a wafer, such as a semiconductor wafer or a glass substrate wafer for liquid crystal display. More particularly, the inventions enable quick heating of a wafer holding member mainly made of an aluminum nitride based sintered body in which various electrodes and heating resistors are embedded and to the invention for improving corrosion resistance against halogenic corrosive gases.

2. Prior Art

In a semiconductor production process, a wafer holding member, such as a susceptor or an electrostatic chuck, is used to hold a wafer in a processing chamber of a CVD apparatus for forming a thin film on a semiconductor wafer, a dry etching apparatus for micromachining the wafer, or the like.

As shown in FIG. 1, a susceptor 10 holds a wafer 30 placed on a disc-shaped base body 11 by pressing the wafer 30 with a clamp ring (not shown). A heating resistor 16 for heating the wafer 30 can be embedded in the base body 11. In addition, as shown in FIG. 2, an electrostatic chuck 20 is provided with a single electrode or a plurality of electrodes (a plasma generation electrode, an electrostatic adhesion electrode, etc.; only the plasma generation electrode 23 is shown in FIG. 2) embedded in a base body 21. By applying DC voltage 25 to the electrode 23, electrostatic adhesion force is generated so as to secure the wafer 30 by adhesion on the surface of the chuck 20.

In addition to holding a semiconductor wafer, this kind of wafer holding member is also used to hold a glass substrate wafer for liquid crystal display or the like.

Ceramics, such as alumina ceramics, has been used as a material for the base body of the susceptor 10 or the electrostatic chuck 20. However, in these days, a proposition has been made to use aluminum nitride ceramics having high thermal conductivity and high corrosion resistance against halogenic corrosive gases (refer to Japanese Laid-open Patent Application No. 6-151332). In this case, tungsten (W) or molybdenum (Mo) is used as a conductive material for the heating resistors 16, 26, electrostatic adhesion electrode and plasma generation electrode 23 embedded in the base bodies 11, 21. In general, a paste of this kind of metal is printed in a predetermined pattern on green sheets made of aluminum nitride and the sheets are laminated and fired integrally.

However, in the production process of the wafer holding member, wherein a conductive material, such as W or Mo, is embedded as the heating resistors 16, 26 or the like in the base bodies 11, 21 made of aluminum nitride ceramics, the base bodies 11, 21 are cracked or the heating resistors 16, 26 made of such a conductive material are separated or disconnected because of the difference in contraction coefficient between the base bodies 11, 21 and the conductive material portions 16, 26 during firing. In particular, when high-purity aluminum nitride ceramics is used for the base bodies 11, 21, the above-mentioned problems due to the difference in contraction coefficient occur significantly.

On the other hand, when the obtained wafer holding member is used, since the thermal expansion coefficient of the aluminum nitride constituting the base bodies 11, 21 is $5 \times 10^{-6}/°$ C., and the thermal expansion coefficients of W and Mo used as conductive materials are 4.6 to $4.8 \times 10^{-6}/°$ C. and $5.7 \times 10^{-6}/°$ C. respectively, cracks and other problems are apt to occur because of the difference in thermal expansion coefficient. For example, in the case of the susceptor 10 in which the heating resistor 16 is embedded, since the ON-OFF pulse control of a voltage of 100 V or more is performed, quick heating occurs during operation. Cracks are thus caused at the interface between the base body 11 and the heating resistor 16, or the heating resistor 16 is separated or disconnected because of the above-mentioned difference in thermal expansion coefficient. Therefore, the susceptor 10 cannot be heated quickly, causing problems of significantly reducing operation efficiency and requiring temperature control during heating.

In the cases of the electrostatic adhesion electrode and the plasma generation electrode 23, quick heating is not necessary. However, cracks or other problems occur in the base bodies 11, 21 during usage for an extended period of time because of the difference in thermal expansion coefficient between the electrodes and the base bodies 11, 21, since the electrodes are large in size.

Furthermore, in these wafer holding members, heating speed, heating temperature, etc. during heating by energizing the heating resistors 16, 26 are controlled in accordance with the following methods:

(1) Temperature is measured by using a thermocouple, and voltage to be applied is changed depending on the measured temperature.

(2) A constant voltage of 120 V or the like is turned on and off repeatedly to control heating speed and heating temperature.

(3) A constant voltage of 120 V or the like is applied for a certain period and then turned on and off repeatedly to control heating temperature.

Among the above-mentioned power application methods for the wafer holding member, the method (1) for adjusting the voltage requires difficult control. Therefore, the method (2) or (3), wherein a constant voltage is turned on and off repeatedly to perform control (referred to as "PID control"), is used usually.

In addition, since such a wafer holding member requires a large output in consideration of heat dissipation due to radiation and conduction and is usually used at a high temperature of 300° C. or more, the heating resistors 16, 26 are designed to have predetermined resistance values in their operating temperature ranges.

However, since the resistance values of the conductive materials constituting the heating resistors 16, 26 generally increase as the temperature rises, the resistance values of the heating resistors 16, 26 at room temperature are lower than the predetermined values. For this reason, when a constant voltage is applied in accordance with the above-mentioned method (2) or (3), there is a danger of causing overcurrent at room temperature.

When 1500 W is required at 500° C. by using a 120 V AC power supply 14 or 24, the resistance value of the heating resistor 16 or 26 is 9.6 Ω, and a current of 12.5 A flows. In case the heating resistor 16 or 26 is made of WC, its resistance value at 500° C. is nearly three times as high as the resistance value at room temperature. Accordingly, the resistance value at room temperature is 3.2 Ω. When a voltage of 120 V is applied, a current of 37.5 A flows. When an overcurrent of 20 A or more flows in this way, a thermal stress due to abrupt temperature change occurs, thereby causing cracks in the base bodies 11, 21 and breaking lead wires and terminals for energizing the heating resistors 16, 26.

These are problems caused during production and usage because of a substantial difference in thermal expansion coefficient between the base body and the energized portions (heating resistors and electrodes). In particular, special attention should be paid to the fact that the wafer holding member cannot be heated abruptly.

An aluminum nitride based sintered body is used for the wafer because of the following reasons: As described earlier, the aluminum nitride based sintered body is superior in heat resistance and thermal shock resistance, and hardly corroded by halogenic corrosive gases, and yet has high thermal conductivity. The aluminum nitride based sintered body contains a sintering aid, such as a rare-earth oxide, Ni compound, rare-earth fluoride or fluoride, to have higher thermal conductivity.

However, the above-mentioned aluminum nitride based sintered body contains about 97 wt % of AlN; the sintered body does not have high purity. Furthermore, since the sintered body contains a sintering aid, numerous grain boundary phases are present in the sintered body. When this corrosion-resistant member made of the sintered body is used in a plasma-generated halogenic corrosive gas atmosphere, the grain boundary phases are etched and aluminum nitride particles are separated. As a result, sufficient corrosion resistance is not obtained.

Besides, when a wafer, such as a semiconductor wafer or a glass substrate wafer for liquid crystal display, is subjected to film forming or micromachining by using the wafer holding member made of an aluminum nitride based sintered body in a plasma-generated halogenic corrosive gas atmosphere, the wafer mounting surface made of the aluminum nitride based sintered body is etched and particles are generated, causing the problem of adversely affecting the traces or the like on the wafer.

Moreover, since the aluminum nitride based sintered body constituting the wafer holding member contains large amounts of a sintering aid and impurities, such as Na, Ca and Fe, there is a fear of contaminating the wafer.

These problems are raised because the conventional aluminum nitride based sintered body has insufficient corrosion resistance against halogenic corrosive gases.

SUMMARY OF THE INVENTION

A first object of the present invention is therefore to provide a wafer holding member capable of being heated quickly by reducing adverse effects due to the difference in thermal expansion efficiency between the base body and the conductive portions (heating resistors and various electrodes). A second object of the present invention is to provide a wafer holding member having superior corrosion resistance against halogenic corrosive gases.

A means for attaining the first object includes three inventions regarding improvements in the compositions of the base body and the conductive portions of the wafer holding member, and one invention regarding the ratio between the number of the resistors installed and the resistance values of the resistors. A means for attaining the second object includes one invention regarding the combination of the compositions of the base body of the wafer holding member and the average diameter of their crystal particles. Furthermore, the three inventions regarding improvements in the compositions of the base body and the conductive portions relate to the compositions used for the combination of the base body and the conductive portions (heating resistors and an electrostatic adhesion electrode or a plasma generation electrode) of the wafer holding member.

In the following disclosure, these inventions are referred to as the 1a invention, the 1b invention, the 1c invention, the second invention and the third invention in the order described above for convenience in explanation.

The 1a invention is concerned with a wafer holding member comprising a base body made of an aluminum nitride based sintered body, and a heating resistor embedded in the base body, the heating resistor being made of a mixture containing 90 to 99 wt % of at least one of W, Mo, WC, TiC and TiN, and 1 to 10 wt % of AlN. The 1b invention is concerned with a wafer holding member comprising a base body made of an aluminum nitride based sintered body, and an electrostatic adhesion electrode embedded in the base body, the electrostatic adhesion electrode being made of a mixture containing 50 to 99 wt % of at least one of W, Mo, WC, TiC and TiN, and 1 to 50 wt % of AlN. The 1c invention is concerned with a wafer holding member comprising a base body made of an aluminum nitride based sintered body, and a plasma generation electrode embedded in the base body, the plasma generation electrode being made of a mixture containing 80 to 99 wt % of at least one of W, Mo, WC, TiC and TiN, and 1 to 20 wt % of AlN.

With these configurations, the base body is made in close contact with the heating resistor, the electrostatic adhesion electrode and the plasma generation electrode, thereby preventing the base body from being cracked and also preventing the heating resistor from being separated and disconnected even during quick heating. Consequently, the present invention can provide a high-performance wafer holding member capable of being heated quickly up to 600° C. in 10 minutes.

The second invention is concerned with a wafer holding member comprising a ceramic base body constituting a wafer holding surface, and a plurality of heating resistors numbered 1 to n ($n \geq 2$), embedded in the base body and energized successively, wherein the ratio of the resistance value of the heating resistor numbered m (m=2 to n) to the resistance value of the heating resistor numbered m-1 is in a range of 1.5 to 4.

This configuration can prevent overcurrent from flowing through all the heating resistors. Quick heating is thus possible and high output can be delivered at a high temperature range of 300° C. or more without damaging the ceramic base body and the lead wires. Furthermore, since the resistors are controlled in accordance with the PID control, wherein a constant voltage is turned on and off repeatedly, the resistors can be used easily.

The third invention is concerned with a wafer holding member, wherein the mounting surface for holding a wafer, such as a semiconductor wafer or a glass substrate wafer for liquid crystal display, is made of an aluminum nitride based sintered body containing 99 wt % or more of AlN and 1500 ppm or less of silicon.

With this configuration, the wafer holding member is hardly etched even when it is placed in a plasma-generated halogenic corrosive gas atmosphere. In addition, since the wafer holding member is made of a high-purity aluminum nitride based sintered body, a wafer, such as a semiconductor wafer or a glass substrate wafer for liquid crystal display, is not contaminated or adversely affected by dielectric breakdown or the like.

The 1a, 1b, 1c, second and third inventions will be described below in detail by referring to the drawings of preferred embodiments.

BRIEF DESCRIPTION OF THE DRAWINGS

FIGS. 3 (A) and 3 (B) are sectional views showing wafer holding members, that is, susceptors in accordance with embodiments of the 1a invention;

FIG. 10 (A) is a partially cutaway perspective view of the electrostatic chuck and FIG. 10 (B) is a sectional view of the electrostatic chuck.

Figure 1:
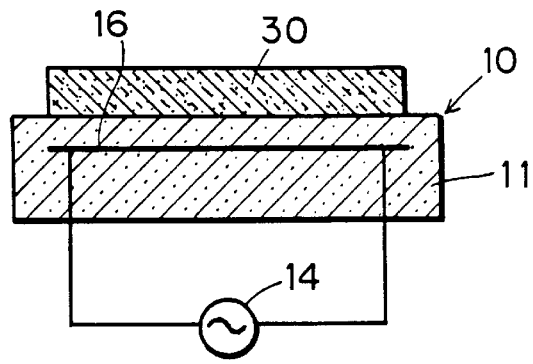
FIG. 1 is a sectional view showing a conventional susceptor.

To facilitate the understanding of the disclosure described below, the relationship among the 1a, 1b, 1c, second and third inventions, and drawings is shown in the table below.

|  | Drawings |
| --- | --- |
| 1a invention | 3 (A), 3 (B) |
| 1b invention | 4 |
| 1c invention | 4 |
| Second invention | 5, 6, 7 (A), 7 (B), 8 |
| Third invention | 9–11 |

DETAILED DESCRIPTION OF THE INVENTION

As described above, the 1a invention is concerned with a wafer holding member comprising a base body made of an aluminum nitride based sintered body, and a heating resistor embedded in the base body, the heating resistor being made of a mixture containing 90 to 99 wt % of at least one of W, Mo, WC, TiC and TiN, and 1 to 10 wt % of AlN.

The heating resistor made of the above-mentioned mixture is thermally stable during temperature rising/lowering and at high temperatures. In addition, AlN contained in the mixture enhances binding to the aluminum nitride sintered body constituting the base body of the wafer holding member, thereby preventing the heating resistor from being separated from the base body and also preventing the heating resistor from being cracked.

Furthermore, the 1b invention is concerned with a wafer holding member comprising a base body made of an aluminum nitride based sintered body, and an electrostatic adhesion electrode embedded in the base body, the electrostatic adhesion electrode being made of a mixture containing 50 to 99 wt % of at least one of W, Mo, WC, TiC and TiN, and 1 to 50 wt % of AlN.

Furthermore, the 1c invention is concerned with a wafer holding member comprising a base body made of an aluminum nitride based sintered body, and a plasma generation electrode embedded in the base body, the plasma generation electrode being made of a mixture containing 80 to 99 wt % of at least one of W, Mo, WC, TiC and TiN, and 1 to 20 wt % of AlN.

In the 1c invention, the plasma generation electrode also comprises a mixture of at least one of W, Mo, WC, TiC and TiN, and AlN, Just as the heating resistor and the electrostatic adhesion electrode, thereby enhancing binding to the base body, preventing the plasma generation electrode from being separated from the base body and also preventing the electrode from being cracked during usage for an extended period of time.

EXAMPLE 1

1a Invention

An embodiment in accordance with the 1a invention will be described below by taking a susceptor as an example.

In a susceptor 10 shown in FIG. 3 (A), a heating resistor 12 is embedded in a base body 11 made of an aluminum nitride based sintered body, and lead wires 13 are provided so that the heating resistor 12 is energized and generates heat. A semiconductor wafer 30 placed on the surface of the susceptor 10 is held in a processing chamber of a CVD apparatus, a dry etching apparatus or the like. The heating resistor 12 is energized to heat the semiconductor wafer 30. Consequently, the wafer 30 can be processed in various ways.

The aluminum nitride based sintered body constituting the base body 11 should preferably be a high-purity aluminum nitride based sintered body containing 99 wt % or more of AlN. In other words, when the content of AlN is 99 wt % or more, preferably 99.5 wt % or more, and more preferably 99.8 wt % or more, the sintered body is almost free from grain boundary phases and can have superior corrosion resistance. In addition, when the content of AlN is in the above-mentioned range, the thermal conductivity of the sintered body can be raised to 65 W/m.k or more. Furthermore, to enhance the corrosion resistance in a halogenic corrosive gas atmosphere, the content of silicon should be 1500 ppm or less, preferably 1000 ppm or less. The content of other impurities, such as Na, Ca, Fe, etc., should preferably be 2000 ppm or less in total. Moreover, the average diameter of the crystal particles of the aluminum nitride based sintered body should be 5 to 50 µm, preferably 20 to 30 µm.

The aluminum nitride based sintered body constituting the base body 11 is not limited to the above-mentioned high-purity sintered body. An aluminum nitride based sintered body containing 0.5 to 20 wt % of an oxide of a group 2a element in the periodic table, such as CaO, SrO or BaO, or an oxide of a group 3a element in the periodic table, such as $Y_2O_3$, $Er_2O_3$ or $Yb_2O_3$, as a sintering aid may also be used. Furthermore, an aluminum nitride based sintered body, the thermal conductivity of which is raised up to the range of 180 to 250 W/m.k by vaporizing such a sintering aid in a firing process so that the content of the sintering aid is in the range of about 0.001 to 1 wt %, can also be used suitably.

On the other hand, the heating resistor 12 is made of a mixture of 90 to 99 wt % of at least one of W, Mo, WC, TiC and TiN, and 1 to 10 wt % of AlN. These components are limited in the above-mentioned ranges because of the following reasons. When the content of at least one of W, Mo, WC, TiC and TiN is less than 90 wt %, or when the content of AlN is more than 10 wt %, the electrical resistance value of the heating resistor 12 becomes too large and unstable, and suitable heating characteristics are not obtained. Conversely, when the content of at least one of W, Mo, WC, TiC and TiN is more than 99 wt %, or when the content of AlN is less than 1 wt %, the adhesion between the heating resistor 12 and the base body 11 is reduced. The content of at least one of W, Mo, WC, TiC and TiN should preferably be in the range of 93 to 96 wt %, and the content of AlN should preferably be in the range of 4 to 7 wt %, By containing AlN in the heating resistor 12, the adhesion to the base body 11 can be enhanced. Consequently, the base body 11 can be prevented from being cracked, and the heating resistor 12 can be prevented from being separated and disconnected even during quick heating.

The susceptor 10 of the 1a invention can be produced as described below. AlN powder having an average particle diameter of about 1.2 $\mu$m, having a purity of 99% or more and containing 1000 ppm or less of silicon, preferably 500 ppm or less, as an impurity is prepared. Only a binder and a solvent are added to and mixed with the AlN powder to obtain slurry. A plurality of green sheets having a thickness of about 0.5 mm are formed from the slurry by the doctor-blade process. A resistor paste having a specific surface area (BET) of 2 $m^2/g$ or more, and having a viscosity being adjusted by mixing powder of at least one of W, Mo, WC, TiC and TiN, and powder of AlN, is screen-printed on one of the green sheets to form the heating resistor 12.

A plurality of the green sheets are then laminated on the above-mentioned heating resistor 12 and contact-bonded at a pressure of 50 $kg/cm^2$. Next, the lamination is cut to form a disc, subjected to vacuum dewaxing and fired at about 2000° C. in a vacuum atmosphere. As a result, the susceptor 10 made of an aluminum nitride based sintered body having a purity of 99% or more and containing 1000 ppm or less of silicon can be obtained. The connections between the internal heating resistor 12 and the lead wires 13 can be made by brazing the metal rods or the like of the lead wires 13 via a metalized layer (not shown), for example.

The thickness, printing pattern, etc. of the heating resistor 12 can be adjusted as desired to obtain a predetermined resistance value. In addition, the resistance value can be adjusted to a lower value by forming the heating resistor 12 in a multilayer configuration, as shown in FIG. 3 (B).

Test 1

1a Invention

Powder of at least one of W, Mo, WC, TiC and TiN having an average particle diameter of 1.0 $\mu$m and AlN powder having an average particle diameter of about 1.2 $\mu$m were prepared as materials of the heating resistor 12. After these materials were mixed in ball mills in the ratios shown in Table 1, a binder and a solvent were added to and mixed. The solvent was evaporated by an evaporator, and the resistor pastes thus obtained were adjusted so as to have final resistance values in the range of 4 to 6 $\Omega$, whereby samples of the heating resistor 12 were formed.

A voltage of 150 V turned on and off repeatedly was applied to the susceptor 10 and the heating characteristics of the susceptor 10 were evaluated. As a concrete evaluation method, after a quick heating test cycle of raising the temperature from room temperature to 600° C. in a vacuum chamber was repeated 100 times, the heating resistor 12 was checked for wire breakage and the base body 11 was checked for cracks. The results of the test are shown in Table 1.

According to the results shown in Table 1, in the case of samples containing less than 1 wt % of AlN in the heating resistor 12, the base body 11 was cracked because of low adhesion between the base body 11 and the heating resistor 12. In the case of samples containing more than 10 wt % of AlN, the heating resistor 12 had a high resistance value even when the resistor 12 was formed in a multilayer configuration having a plurality of patterns as shown in FIG. 3 (B). As a result, the predetermined resistance value was unable to be obtained.

However, in the case of samples in accordance with the 1a invention containing 1 to 10 wt % of AlN in the heating resistor 12, the resistor 12 was not cracked or disconnected, and had superior durability.

TABLE 1

| Sample No. | Heating resistor Composition (wt %) | Thickness ($\mu$m) | Patterns | Condition after quick heating test |
|---|---|---|---|---|
| 1 | W 100 AlN 0 | 12 | 1 | Cracked |
| 2 | W 99 AlN 1 | 12 | 1 | Normal |
| 3 | W 95 AlN 5 | 14 | 1 | Normal |
| 4 | W 90 AlN 10 | 12 | 3 | Normal |
| *5 | W 87 AlN 13 | 12 | 9 | Increased resistance |
| *6 | W 84 AlN 16 | 14 | Unable to be produced | |
| *7 | Mo 100 AlN 0 | 12 | 1 | Cracked |
| 8 | Mo 99 AlN 1 | 12 | 1 | Normal |
| 9 | Mo 95 AlN 5 | 14 | 1 | Nornal |
| 10 | Mo 90 AlN 10 | 12 | 3 | Normal |
| *11 | Mo 87 AlN 13 | 12 | 9 | Increased resistance |
| *12 | WC 100 AlN 0 | 18 | 1 | Cracked |
| 13 | WC 99 AlN 1 | 18 | 1 | Normal |
| 14 | WC 95 AlN 5 | 22 | 1 | Normal |
| 15 | WC 90 AlN 10 | 18 | 3 | Normal |
| *16 | WC 87 AlN 13 | 18 | 9 | Increased resistance |
| *17 | TiN 100 AlN 0 | 20 | 1 | Cracked |
| 18 | TiN 99 AlN 1 | 20 | 1 | Normal |
| 19 | TiN 95 AlN 5 | 24 | 1 | Normal |
| 20 | TiN 90 AlN 10 | 20 | 3 | Normal |
| *21 | TiN 87 AlN 13 | 20 | 9 | Increased resistance |

*indicates samples not corresponding to the 1a invention.

EXAMPLE 2

1b Invention

Next, an embodiment in accordance with the 1b invention will be described below by taking an electrostatic chuck as an example.

Figure 4:
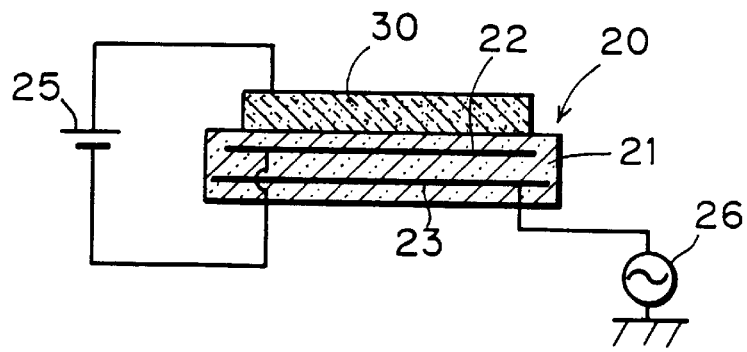
FIG. 4 is a sectional view showing an example of an electrostatic chuck in accordance with an embodiment of the 1b invention, wherein a plasma generation electrode in accordance with the 1c invention is embedded.

In the electrostatic chuck 20 shown in FIG. 4, an electrostatic adhesion electrode 22 and a plasma generation electrode 23 are embedded in a base body 21 made of an aluminum nitride based sintered body, and lead wires (not shown) are provided to supply electricity to the electrodes.

By applying voltage 25 between the electrostatic adhesion electrode 22 and a semiconductor wafer 30, adhesion force is generated on the surface of the base body 21 and the semiconductor wafer 30 can adhere to the base body 21. Although a single-electrode type is shown in FIG. 4, a plurality of electrostatic adhesion electrodes 22 can be embedded in the base body 21 to form a dual-electrode type, wherein voltage is applied between the electrodes. In addition, by applying high-frequency voltage 26 between the plasma generation electrode 23 and an upper electrode 24, plasma can be generated between the electrodes and the semiconductor wafer 30 can be subjected to etching, the CVD process or the like.

The high-purity aluminum nitride based sintered body used for the above-mentioned embodiment, or an aluminum nitride based sintered body containing a sintering aid can also be used as the aluminum nitride based sintered body constituting the base body 21. The production method of the electrostatic chuck 20 is similar to that of the above-mentioned embodiment.

Furthermore, the electrostatic adhesion electrode 22 is made of a mixture of 50 to 99 wt % of at least one of W, Mo, WC, TiC, and TiN, and 1 to 50 wt % of AlN. These components are limited in the above-mentioned ranges because of the following reasons. When the content of AlN is less than 1 wt % or when the content of at least one of W, Mo, WC, TiC and TiN is more than 99 wt %, the adhesion between the electrode 22 and the base body 21 is reduced. On the other hand, when the content of AlN is more than 50 wt % or when the content of at least one of W, Mo, WC, TiC and TiN is less than 50 wt %, the resistance value of the electrode 22 becomes too high. Since no current flows in the electrostatic adhesion electrode 22, the resistance value of the electrostatic adhesion electrode 22 can be made higher than that of the heating resistor of the above-mentioned embodiment 1, and the content of AlN can be made high.

The plasma generation electrode 23 is configured as shown in FIG. 4. According to the 1c invention, the electrode 23 is made of a mixture of 80 to 99 wt % of at least one of W, Mo, WC, TiC and TiN, and 1 to 20 wt % of AlN and embedded in the base body 21 made of an aluminum nitride based sintered body. These components are limited in the above-mentioned ranges because of the following reasons. When the content of AlN is less than 1 wt % or when the content of at least one of W, Mo, WC, TiC and TiN is more than 99 wt %, the adhesion between the electrode 23 and the base body 21 is reduced. On the other hand, when the content of AlN is more than 20 wt % or when the content of at least one of W, Mo, WC, TiC and TiN is less than 80 wt %, the resistance value of the electrode 23 becomes too high. Preferably, the content of at least one of W, Mo, WC, TiC and TiN should be in the range of 90 to 99 wt %, and the content of AlN should be in the range of 1 to 10 wt %.

The above-mentioned plasma generation electrode 23 should preferably be formed in an area wider than that of the semiconductor wafer 30. This configuration is necessary to generate plasma over the entire surface of the semiconductor wafer 30, to process the entire surface of the semiconductor wafer 30 and to efficiently take chips. In this case, although part of the base body 21 is exposed to plasma, the base body 21 is not etched significantly by plasma since the base body 21 is made of an aluminum nitride based sintered body having high corrosion resistance as described above.

Since the electrostatic adhesion electrode 22 and the plasma generation electrode 23 contain AlN, the adhesion of the electrodes 22, 23 to the base body 21 is high, and prevented from being cracked even during usage for an extended period of time.

In the above-mentioned embodiment 2, the electrostatic adhesion electrode 22 and the plasma generation electrode 23 are formed independently. However, a single electrode can be used as the two electrodes. In this case, the composition ranges of the electrostatic adhesion electrode 22 should be the same as those of the plasma generation electrode 23.

Furthermore, a heating resistor embedded in the base body 21 of the electrostatic chuck 20 can be used for heating.

In the above-mentioned embodiments 1 and 2, the susceptor and the electrostatic chuck are described as wafer holding members for holding only the semiconductor wafer 30. However, it is needless to say to that the 1a, 1b and 1c inventions are also applicable to wafer holding members for holding a variety of wafers, such as a glass substrate wafer for liquid crystal display, other than semiconductor wafers.

As described above, according to the 1a invention, the heating resistor is made of a mixture of 90 to 99 wt % of at least one of W, Mo, WC, TiC and TiN, and 1 to 10 wt % of AlN and embedded in the base body made of an aluminum nitride based sintered body to form a susceptor. Therefore, the adhesion between the base body and the heating resistor can be enhanced, and the base body can be prevented from being cracked, and the heating resistor can be prevented from being separated and disconnected even during quick heating. Consequently, a high-performance wafer holding member capable of being subjected to quick heating of up to 600° C. in 10 minutes can be provided.

Furthermore, according to the 1b invention, the electrostatic adhesion electrode is made of a mixture of 50 to 95 wt % of at least one of W, Mo, WC, TiC and TiN, and 5 to 50 wt % of AlN and embedded in the base body made of an aluminum nitride based sintered body so as to form a wafer holding member. Therefore, the adhesion between the base body and the electrostatic adhesion electrode can be enhanced, the base body can be prevented from being cracked, and the electrostatic adhesion electrode can be prevented from being separated during usage. Consequently, the wafer holding member can be used successfully for an extended period of time.

Moreover, according to the 1c invention, the plasma generation electrode is made of a mixture of 80 to 99 wt % of at least one of W, Mo, WC, TiC and TiN, and 1 to 20 wt % of AlN and embedded in the base body made of an aluminum nitride based sintered body so as to form a wafer holding member. Therefore, the adhesion between the base body and the plasma generation electrode can be enhanced, and the base body can be prevented from being cracked and the plasma generation electrode can be prevented from being separated during usage. Consequently, the wafer holding member can be used successfully for an extended period of time.

The second invention is concerned with a wafer holding member comprising a base body constituting a wafer holding surface, and a plurality of heating resistors numbered 1 to n (n≧2), embedded in the base body and energized successively, wherein the ratio of the resistance value of the heating resistor numbered m (m=2 to n) to the resistance value of the heating resistor numbered m-1 is in the range of 1.5 to 4. The above-mentioned ratio of the resistance values is based on values at room temperature.

EXAMPLE 1

Second Invention

The embodiment of the second invention is described below.

Figure 5:
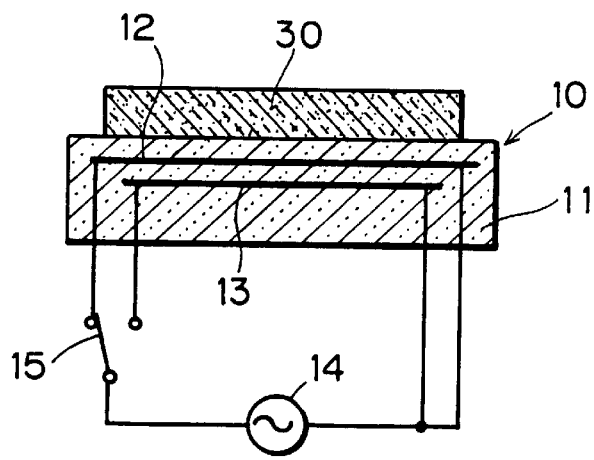
FIG. 5 is a sectional view showing a susceptor in accordance with an embodiment of the wafer holding member of the second invention.

A susceptor 10 shown in FIG. 5 comprises two kinds of resistors, a first heating resistor 12 and a second heating resistor 13, embedded in a disc-shaped ceramic base body 11, a high-frequency power supply 14 for energizing the heating resistors 12, 13 and a switch 15 for selectively energizing the first heating resistor 12 and the second heating resistor 13. The susceptor 10 is adapted so that a wafer 30 is placed on the base body 11.

Resistance value $R_1$ of the first heating resistor 12 at room temperature is set to an optimum value in a temperature range of room temperature to 300° C. On the other hand, resistance value $R_2$ of the second heating resistor 13 at room temperature is lower than resistance value $R_1$. However, when the second heating resistor 13 is heated at 300° C. or more, resistance value $R_2$ is set to have an optimum resistance value.

When this susceptor 10 is used, the first heating resistor 12 having a higher resistance value is selected by the switch 15 and energized to generate heat. A temperature detector (not shown), such as a thermocouple, detects the temperature of the base body 11. When the temperature rises to 300° C. or more, the second heating resistor 13 having a lower resistance value is selected by the switch 15 and energized. In other words, the first heating resistor 12 having the optimum resistance value $R_1$ in the temperature range of room temperature to 300° C. is first energized to generate heat. As the temperature rises, the resistance value of the first heating resistor becomes higher, and its heating value is lowered. On the other hand, resistance value $R_2$ of the second heating resistor 13 becomes higher as the temperature rises, and becomes an optimum resistance value at 300° C. or more. With this configuration, when the temperature is 300° C. or more, energization is switched from the first heating resistor 12 to the second heating resistor 13. In this way, a heating resistor having an optimum resistance value can be energized selectively at all times. As a result, efficient heating can be attained without causing overcurrent.

In the above-mentioned embodiment, although the setting temperature selected by the switch 15 is 300° C., the setting temperature can be adjusted as desired in accordance with the operation conditions and other conditions. Furthermore, although the optimum resistance value differs depending on the shape, dimensions and operation conditions of the susceptor 10, the resistance value may be set so as to prevent an overcurrent of 20 A or more.

To obtain this kind of effect, the ratio of the resistance value of the first heating resistor 12 and that of the second heating resistor 13 is important. Ratio $R_1/R_2$ of the resistance value $R_1$ of the first heating resistor 12 at room temperature and the resistance value $R_2$ of the second heating resistor 13 at room temperature is set in the range of 1.5 to 4. If ratio $R_1/R_2$ is less than 1.5, the difference between the two resistance values is too small, and the above-mentioned effect cannot be obtained. On the other hand, if ratio $R_1/R_2$ is more than 4, the difference between the two resistance values is too large, and the temperature cannot be raised smoothly when resistor selection is performed by the switch 15.

Furthermore, the means for measuring temperature is not limited to the above-mentioned thermocouple, but for example, a means for measuring the resistance value of the first heating resistor 12 or the second heating resistor 13 can be provided to detect a change in the resistance value so as to detect a change in temperature. Alternatively, the selection by the switch 15 may be performed after a certain lapse of time preset by a timer or the like.

Although the embodiment shown in FIG. 5 is provided with the first heating resistor 12 and the second heating resistor 13, an embodiment having three or more heating resistors to be selected two or more times can be used to attain a more meticulous temperature change. In this case, heating resistors numbered 1 to n (n≧2) and energized successively are provided, wherein the ratio of the resistance value of the heating resistor numbered m (m=2 to n) to the resistance value of the heating resistor numbered m-1 should be in the range of 1.5 to 4. In other words, the ratio of the resistance values, at room temperature, of the two heating resistors to be selected should be in the range of 1.5 to 4.

EXAMPLE 2

Second Invention

Figure 6:
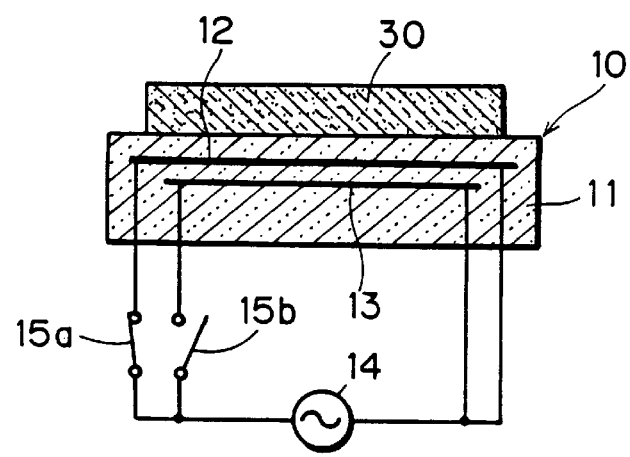
FIG. 6 is a sectional view showing a susceptor in accordance with another embodiment of the wafer holding member of the second invention.

Furthermore, in another susceptor in accordance with the embodiment of the second invention shown in FIG. 6, two switches 15a, 15b connected to the two resistors: the first heating resistor 12 and the second heating resistor 13, respectively can be provided. In this case, only the switch 15a connected to the first heating resistor 12 is closed first to generate heat. When the temperature of the base body 11 exceeds a first setting temperature, the switch 15a is opened and the switch 15b connected to the second heating resistor 13 is closed. When the temperature exceeds a second setting temperature, both the switches 15a, 15b are closed to energize both the first heating resistor 12 and the second heating resistor 13, whereby the resistance value can be lowered further and three-step selection can be performed. In this case, the combined resistance value of the first heating resistor 12 and the second heating resistor 13 connected in parallel is used as the resistance value of a third heating resistor.

In the above-mentioned embodiment, the base body 11 is made of a ceramics selected from among alumina, silicon nitride, aluminum nitride, etc. In particular, an aluminum nitride ceramics is best suited in view of corrosion resistance and thermal conductivity.

More specifically, an aluminum nitride based sintered body having an average crystal particle diameter of 5 to 50 $\mu$m, preferably 20 to 30 $\mu$m, containing 99 wt % or more of AlN, preferably 99.5 wt % or more, more preferably 99.8 wt %, 1500 ppm or less of silicon, preferably 1000 ppm or less, and 2000 ppm or less of other impurities such as Na, Ca and Fe in total should preferably be used. This kind of high-purity aluminum nitride based sintered body hardly includes grain boundary phases and can be made superior in corrosion resistance. Furthermore, since its thermal conductivity is a high value of 65 W/m.k, quick heating and uniform heating can be attained easily.

Moreover, the material of the base body 11 is not limited to the high-purity aluminum nitride ceramics. An oxide of a group 2a element in the periodic table, such as CaO, SrO or BaO, or an oxide of a group 3a element in the periodic table, such as $Y_2O_3$, $Er_2O_3$ or $Yb_2O_3$, may be added in a ratio of 0.5 to 20 wt % as a sintering aid. Besides, a material having a high thermal conductivity of 180 to 250 W/m.k obtained by evaporating the sintering aid component in the range of about 0.001 to 1 wt % in a firing process can also be used.

On the other hand, the first heating resistor 12 or the second heating resistor 13 is made of a metal having a high melting point, a carbide of a metal or a nitride of a metal, such as W, Mo, WC, TiC or TiN. Alternatively, when an aluminum nitride ceramics is used for the base body 11, the heating resistor is made of a mixture containing 90 to 99 wt % of a metal, a carbide of a metal or a nitride of a metal described above and 1 to 10 wt % of AlN. As a result, the adhesion between the heating resistor and the base body 11 can be enhanced and the base body 11 is prevented from being separated and disconnected even during quick heating.

The first heating resistor 12 and the second heating resistor 13 having resistance values different from each other as described above can be formed by changing the material, thickness, wire width, pattern shape, etc. thereof. For example, it is possible to use resistors made of the same material but different in thickness or wire width, or resistors having the same pattern shape but made of materials different in volume resistivity.

If materials different in volume resistivity are used, it is possible that both the first heating resistor 12 and the second heating resistor 13 are made of a mixture of a conductive material, such as W, Mo, WC, TiC or TiN, and AlN, while the content of AlN in the first heating resistor 12 is made higher so as to increase its resistance value.

Figure 7A:
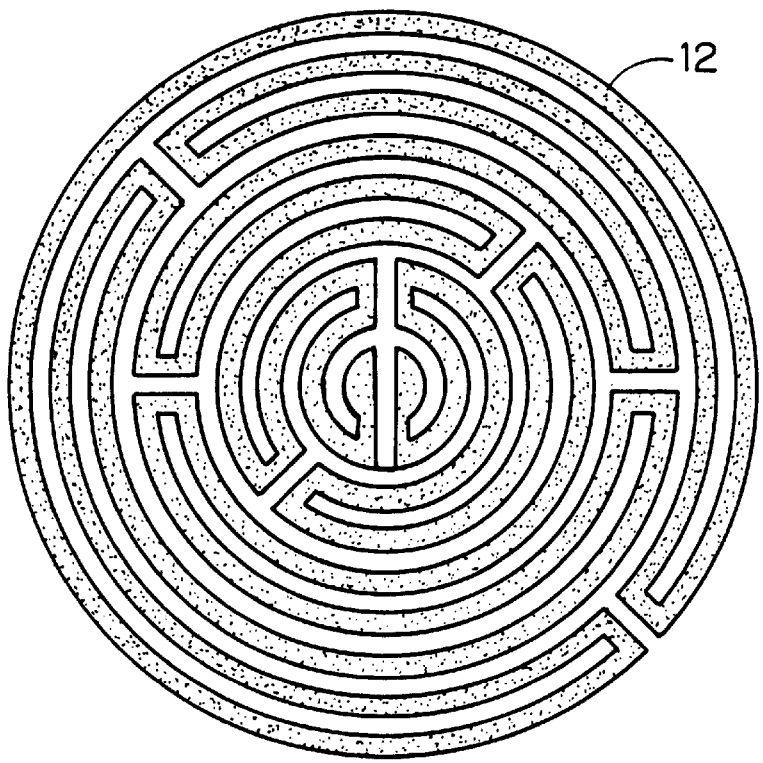
FIGS. 7 (A) and 7 (B) are plan views of the heating resistors of the susceptors shown in FIGS. 5 and 6.
Figure 7B:
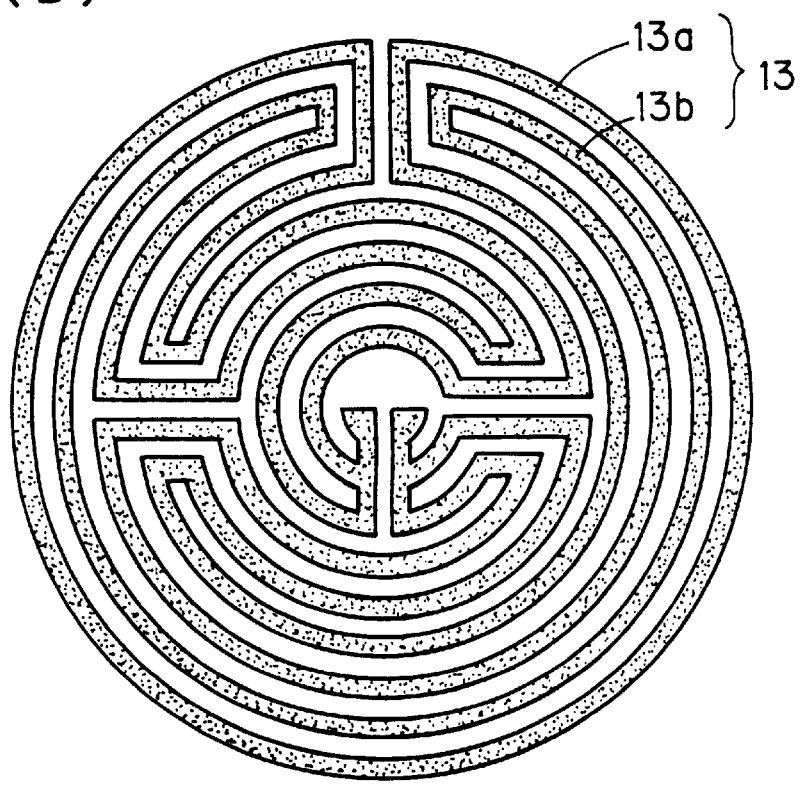

Additionally, while the two resistors 12, 13 are made identical in material, thickness and wire width, the first heating resistor 12 can be formed in a pattern of a single line as shown in FIG. 7 (A), and the second heating resistor 13 can be formed in a pattern of two lines 13a, 13b connected in parallel as shown in FIG. 7 (B) so as to have a lower resistance value.

On the other hand, while the two resistors 12, 13 are made identical in material, thickness, wire width and pattern shape, the first heating resistor 12 can be formed in a single layer, and the second heating resistor 13 can be formed in multilayers connected in parallel so as to have a lower resistance value. Alternatively, both the resistors 12, 13 can be formed in the same pattern shape shown in FIG. 7 (B), and either of the two wires 13a, 13b can be cut in the case of the heating resistor to be provided with a higher resistance value.

The above-mentioned susceptor 10 is produced as described below. AlN power having a purity of 99% or more, for example, is prepared. Only a binder and a solvent are added to and mixed with the AlN powder to obtain slurry. From the slurry, a plurality of green sheets having a thickness of about 0.5 mm are formed by the doctor-blade process. A conductive paste made of a powder mixture of a conductive material, such as W, Mo, WC, TiC or TiN, and AlN, and having an adjusted viscosity is used to form the two different heating resistors: the first heating resistor 12 and the second heating resistor 13 having different resistance values, on the above-mentioned green sheets. The green sheets are laminated and contact-bonded at a pressure of about 50 kg/cm², cut into a disc, subjected to vacuum dewaxing, and then fired at about 2000° C. in a nitrogen atmosphere, whereby the susceptor 10 in accordance with the second invention can be obtained. The internal connection of the lead wires to the first heating resistor 12 and the second heating resistor 13 can be attained by brazing metal rods or the like via metalized layers.

The susceptor 10 in accordance with the second invention shown in FIG. 5 was produced in the method described above. The base body 11 was made of a high-purity aluminum nitride ceramics having a diameter of 8 inches and a thickness of 10 mm. The first heating resistor 12 was formed so as to have resistance value $R_1$ of 9.6 Ω at room temperature, while the second heating resistor 13 was formed so as to have resistance value $R_2$ of 3.2 Ω at room temperature, whereby resistance ratio $R_1/R_2$ was set to 3. Since the resistance value of WC at 500° C. is about three times as high as that at room temperature, the second heating resistor 13 has a resistance value of 9.6 Ω at 500° C. When 120 V is applied, the output is 1500 W at 500° C.

Furthermore, the conventional susceptor 10 shown in FIG. 1 and having the same material and shape as the susceptor 10 in accordance with the second invention was produced as a comparison example. The single heating resistor 16 was made of WC and its resistance value was set to 3.2 Ω at room temperature so as to obtain an output of 1500 W at 500° C.

Both the susceptors 10 were set in a vacuum chamber and heated up to 600° C. in accordance with the PID control wherein 120 V was turned on and off repeatedly. However, in the case of the susceptor 10 in accordance with the second invention, the first heating resistor 12 was energized in the temperature range of room temperature to 300° C., and at a temperature of 300° C. or more, the second heating resistor 13 was then selected by the switch 15 and energized.

Test 1

Second Invention

Figure 8:
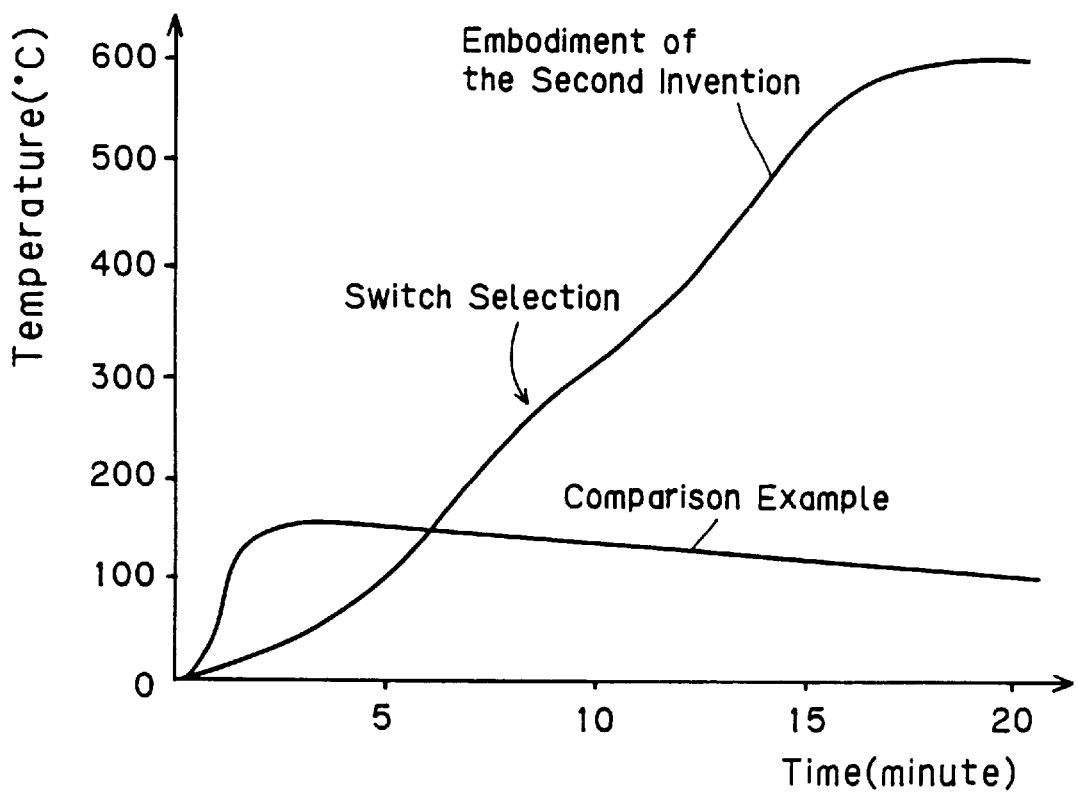
FIG. 8 is a graph showing heating characteristics of the susceptor in accordance with the second invention and a susceptor used as a comparison example.

The result of the test is shown in FIG. 8. In the case of the comparison example having only the heating resistor 16, the heating resistor 16 was disconnected at about 100° C. because of overcurrent. On the other hand, the embodiment of the second invention was able to be used for heating up to 600° C. without causing problems. This can be explained as follows. Until a temperature of up to 300° C. was reached, the first heating resistor 12 having a resistance value of 9.6 Ω was energized. When the second heating resistor 13 was selected by the switch 15 at 300° C., the resistance value of the second heating resistor 13 was raised to about 9.6 Ω. Since these two values were optimal, an overcurrent of 20 A or more did not flow.

Figure 2:
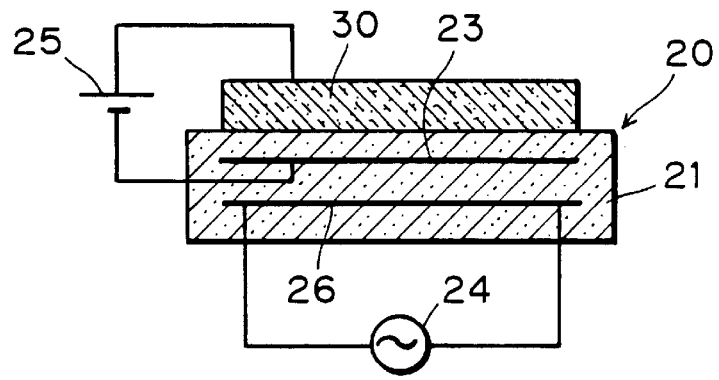
FIG. 2 is a sectional view showing a conventional electrostatic chuck.

Although the susceptor 10 was described in the above-mentioned embodiments, it was confirmed that the second invention was able to be applied to the electrostatic chuck 20 shown in FIG. 2 in the exactly same way. Furthermore, it is needless to say that the wafer holding member of the second invention can also be used to hold a glass substrate wafer for liquid crystal display as well as a semiconductor wafer.

As described above, in the wafer holding member in accordance with the second invention, a plurality of heating resistors numbered 1 to n (n≧2) embedded in the ceramic base body constituting the wafer holding surface and energized successively, wherein the ratio of the resistance value of the heating resistor numbered m (m=2 to n) to the resistance value of the heating resistor numbered m-1 is in the range of 1.5 to 4. Overcurrent is thus prevented from flowing in the heating resistors. With the wafer holding member, quick heating is possible and high output can be generated in the high temperature range of 300° C. or more. Besides, since the PID control conducted by repeating the ON-OFF operation of a constant voltage can be applied, the wafer holding member can be used easily. Consequently, the wafer holding member having the above-mentioned features can be provided by the second invention.

In addition to a aluminum nitride based sintered body, an alumina ($Al_2O_3$) sintered body and a silicon nitride ($Si_3O_4$) sintered body can also be applied to the wafer holding member of the second invention while its superior corrosion resistance is maintained.

The third invention is concerned with a wafer holding member, wherein at least its mounting surface for holding a wafer, such as a semiconductor wafer or a glass substrate wafer for liquid crystal display, is made of an aluminum nitride based sintered body containing 99 wt % or more of AlN and 1500 ppm or less of silicon.

Since the wafer mounting surface in accordance with the third invention is made of a high-purity aluminum nitride based sintered body, the content of grain boundary phases being apt to be etched easily can be decreased significantly.

In particular, by setting the content of AlN to 99 wt % or more, preferably 99.5 wt % or more, most preferably 99.8 wt % or more, grain boundary phases are hardly included in the aluminum nitride based sintered body. The sintered body can thus be superior in corrosion resistance. Besides, when the content of AlN is in the above-mentioned range, the thermal conductivity of the aluminum nitride based sintered body can be raised to 65 W/m.k or more.

Furthermore, no sintering aid is added to the aluminum nitride based sintered body in accordance with the third invention. If any sintering aid is added, it comes into existence at grain boundary phases when the sintered body is formed, whereby corrosion due to plasma is accelerated.

Additionally, as a result of further research zealously conducted on the causes of corrosion in a halogenic corrosive gas atmosphere, the inventors of the third invention found that silicon included as an impurity was apt to react with halogenic corrosive gases, and also found that corrosion was accelerated when the silicon is included in the grain boundary phases of the aluminum nitride based sintered body.

When $CF_4$ is used as a halogenic corrosive gas, for example, silicon causes the following reaction.

Reaction formula $2SiO_2+4F_2=2SiF_4+2O_2$

That is to say, $F_2$ decomposed from $CF_4$ by plasma reacts with the silicon included in the grain boundary phases of the aluminum nitride based sintered body in accordance with the above-mentioned reaction formula to generate $SiF_4$. Since $SiF_4$ is high in volatilization, no protective film is formed and the reaction proceeds, whereby aluminum nitride particles are separated.

To solve this problem, the content of silicon mixed in the aluminum nitride based sintered body constituting the corrosion-resistant member is set to 1500 ppm or less, preferably 1000 ppm or less.

The above-mentioned range is determined as described below. Silicon is included in a starting material as an impurity or enters as an impurity during production. If the content of silicon is 1500 ppm or less, silicon forms a solid solution with aluminum nitride particles. However, if the content of silicon is more than 1500 ppm, the whole content of silicon cannot form a solid solution with the aluminum nitride particles. Silicon is thus deposited in the grain boundary phases in the sintered body. Therefore, the grain boundary phases are etched and silicon reacts with halogenic corrosive gases because of the above-mentioned reason, whereby etching is accelerated and aluminum nitride particles are separated.

In contrast, if the content of silicon is set to 1500 ppm or less, the thermal conductivity of the aluminum nitride based sintered body can be enhanced. In particular, if the content of silicon is set to 1000 ppm or less, the thermal conductivity can be raised to 70 W/m.k or more.

Furthermore, the above-mentioned aluminum nitride based sintered body includes other impurities, such as Na, Ca and Fe. The contents of the impurities should preferably be adjusted to contain 2000 ppm or less in total under the third invention.

Moreover, the average diameter of the crystal particles of the aluminum nitride constituting the sintered body should be in the range of 5 to 50 μm, preferably in the range of 20 to 30 μm. If the average diameter of the crystal particles of the aluminum nitride is more than 50 μm, the strength of the aluminum nitride decreases significantly. On the other hand, the minimum value of the average diameter of the crystal particles of the aluminum nitride is set to 5 μm, since it is difficult to produce smaller particles.

Next, the method for producing the wafer holding member in accordance with the third invention is described below.

First, starting material of AlN powder having an average particle diameter of 3 μm or less, preferably about 1.5 μm, and containing 1500 ppm or less of silicon, preferably 1000 ppm or less, as an impurity, is prepared. Only a binder and a solvent are added to the AlN powder to obtain slurry. From the slurry, a wafer holding member is formed by the doctor-blade process, or the slurry is dried by a spray drier to form granules. The granules are charged into a metal mold and formed by a mechanical press forming process or rubber press forming process. The formed product is then subjected to vacuum dewaxing and fired in a non-oxidative atmosphere at a firing temperature of about 1900 to 2100° C., thereby obtaining a wafer holding member made of an aluminum nitride based sintered body having an average crystal particle diameter of aluminum nitride in the range of 5 to 50 μm, having a purity of 99% or more, and containing 1500 ppm or less of silicon.

It is important to set the firing temperature in the range of 1900 to 2100° C. when producing the wafer holding member in accordance with the third invention. Since the aluminum nitride is a material difficult to sinter and fired without adding sintering aids, the particles of the aluminum nitride cannot be sintered with one another at temperatures lower than the above-mentioned temperature. Furthermore, since the impurities mixed in the production process or the like can be vanished by firing at the above-mentioned temperature, the purity of the sintered body can be enhanced.

In this way, since the wafer holding member in accordance with the third invention is made of a high-purity aluminum nitride based sintered body and the mixture content of silicon is 1500 ppm or less, the wafer holding member superior in corrosion resistance against halogenic corrosive gases can be obtained. Consequently, the wafer holding member in accordance with the third invention has high corrosion resistance and high thermal conductivity and includes less content of impurities adversely affecting wafers. The wafer holding member is thus ideally suited for holding wafers.

An embodiment of the wafer holding member in accordance with the third invention is described below.

EXAMPLE 1

Third Invention

Figure 9:
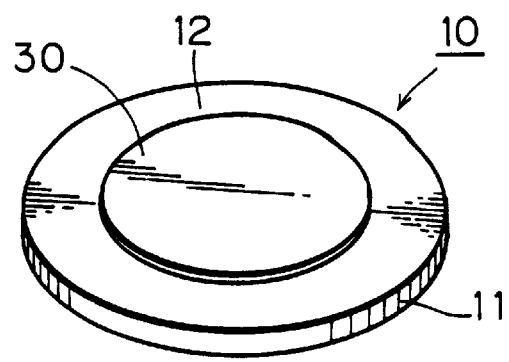
FIG. 9 is a perspective view showing a susceptor in accordance with an embodiment of the wafer holding member of the third invention.

FIG. 9 is a perspective view showing a susceptor 10 as an example of a wafer holding member used in a production process of semiconductors, liquid crystals, etc. A disc 11 is formed by using a corrosion-resistant member made of an aluminum nitride based sintered body having a purity of 99% or more and containing 1000 ppm or less of silicon. A wafer 30, such as a semiconductor wafer or a glass substrate wafer, is placed on the mounting surface 12 of the disc 11 and subjected to film forming and micromachining.

To produce this susceptor, AlN power having an average particle diameter of about 1.2 μm and containing 1000 ppm or less of silicon, preferably 500 ppm or less, as an impurity is prepared first. Only a binder and a solvent are added to the AlN powder. The mixture is kneaded and dried to obtain granules. The granules are charged into a cylindrical rubber mold, formed into a cylindrical shape by a rubber press forming process and subjected to cutting to obtain the disc 11. The disc 11 is then subjected to vacuum dewaxing and fired in a nitrogen atmosphere at a firing temperature of about 2000° C. Consequently, the susceptor 10 made of an aluminum nitride based sintered body having a purity of 99% or more and containing 1000 ppm or less of silicon can be obtained.

Figure 10A:
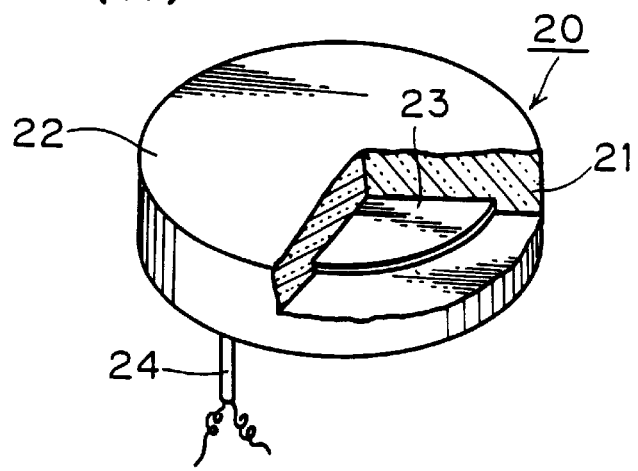
FIGS. 10 (A) and 10 (B) are views showing an electrostatic chuck in accordance with an embodiment of the wafer holding member of the third invention.
Figure 10B:
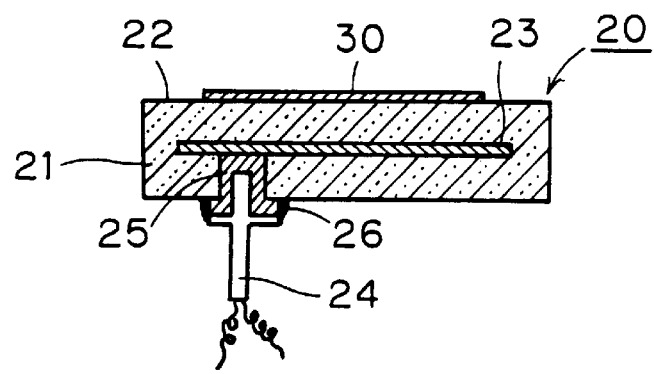

FIGS. 10 (A) and 10 (B) are a partially cutaway perspective view and a sectional view, respectively showing an electrostatic chuck 20 of an example of the wafer holding member. An electrode 23 is embedded in a disc 21. The disc 21 is made of an aluminum nitride based sintered body having a purity of 99% or more and containing 1000 ppm or less of silicon. A wafer 30, such as a semiconductor wafer or a glass substrate wafer for liquid crystal display, is placed on the mounting surface 22 of the disc 21. By applying voltage between the wafer 30 and the electrode 23 in the disc 21, Coulomb's force due to dielectric polarization and Johnsen-Rahbeck's force due to leak current are generated so as to secure the wafer 30 on the mounting surface 22 by adhesion.

The electrostatic chuck 20 is produced as described below. AlN powder having an average particle diameter of about 1.2 $\mu$m, having a purity of 99% or more and containing 1000 ppm or less of silicon, preferably 500 ppm or less, as an impurity is prepared. Only a binder and a solvent are added to the AlN powder to obtain slurry. From the slurry, a plurality of green sheets having a thickness of about 0.5 mm are formed by the doctor-blade process. A conductive paste containing TiN power or tungsten powder and having an adjusted viscosity is screen-printed on one of the green sheets to form the electrode 23. On the electrode 23, a plurality of green sheets are laminated and contact-bonded at a pressure of 50 kg/cm$^2$. The lamination is cut into a disc and subjected to vacuum waxing and then fired at about 2000° C. in a nitrogen atmosphere. Consequently, the electrostatic chuck 20 made of an aluminum nitride based sintered body having a purity of 99% or more and containing 1500 ppm or less of silicon can be obtained. The internal connection between the electrode 23 and a lead wire can be attained by performing brazing 26 of a metal rod 24 or the like via a metalized layer 25.

The electrostatic chuck 20 shown in FIG. 10 is entirely made of the aluminum nitride based sintered body in accordance with the third invention. Alternatively, the chuck 20 can have a different structure, wherein only the mounting surface 22 is made of the above-mentioned aluminum nitride based sintered body while the rest of the chuck 20 is made of a different sintered body; this structure can be obtained such that the green sheet for the mounting surface 22 is laminated on the uppermost lamination of the green sheets for the rest, and the total lamination is then sintered into one body.

Furthermore, when a wafer 30, such as a semiconductor wafer or a glass substrate wafer for liquid crystal display, is subjected to film forming and micromachining while being held by the wafer holding member, such as the susceptor 10 or the electrostatic chuck 20, the wafer holding member is heated from underneath by a heater in some cases so as to indirectly heat the wafer 30. However, the above-mentioned wafer holding member with an embedded heating resistor may be used to directly heat the wafer 30. In particular, since the aluminum nitride based sintered body used for the third invention has a thermal conductivity of 65 W/m.k or more, the wafer 30 can be heated uniformly in a short period of time.

Test 1

Third Invention

Wafer holding member samples made of aluminum nitride based sintered bodies containing various contents of silicon are prepared, and wafer holding member samples made of aluminum nitride based sintered bodies containing various contents of silicon and sintering aids are also prepared. These samples are exposed to a plasma-generated halogenic corrosive gas atmosphere and examined for corrosion.

In this test, aluminum nitride based sintered body samples were prepared by adding 0, 250, 750, 1250 and 1750 ppm of silicon to AlN powder having a purity of 99.3% and containing 250 ppm of silicon as an impurity. An aluminum nitride based sintered body sample made of only AlN powder having a purity of 99.0% and containing 1000 ppm of silicon as an impurity was also prepared. In addition, aluminum nitride based sintered body samples made by adding $Y_2O_3$ or $Er_2O_3$ as a sintering aid to the above-mentioned AlN powder were prepared. These aluminum nitride based sintered body samples were formed into discs measuring 100 mm×100 mm×5 mm and subjected to the plasma etching process for up to 800 hours.

In this etching process, $CF_4$ gas was used as an atmospheric gas and high frequency of 500 W was applied to generate plasma. The amount of aluminum nitride particles deposited to the bottom surface of the wafer was measured in terms of the number of particles by using a microscope of high magnification.

In this test, the samples were evaluated in accordance with the standard described below. After the samples were subjected to the etching process for 400 hours, samples including less than 15 particles having a diameter of 0.3 $\mu$m or more were judged to be superior. The results are shown in Table 2.

TABLE 2

| | No. | AlN (wt %) | Sintering aid (wt %) | Time Si | 100 hrs | 200 hrs | 400 hrs | 800 hrs |
|---|---|---|---|---|---|---|---|---|
| Third invention | 1 | 99.5 | — | 400 ppm | ◯ | ◯ | ◯ | ◯ |
| | 2 | 99.5 | — | 500 ppm | ◯ | ◯ | ◯ | ◯ |
| | 3 | 99.4 | — | 1000 ppm | ◯ | ◯ | ◯ | X |
| | 4 | 99.4 | — | 1500 ppm | ◯ | ◯ | ◯ | X |
| | 5 | 99.1 | — | 1000 ppm | ◯ | ◯ | ◯ | X |
| Comparison example | 6 | 99.4 | — | 2000 ppm | X | X | X | X |
| | 7 | 96.4 | $Y_2O_3$— 3 | 500 ppm | X | X | X | X |
| | 8 | 96.0 | $Y_2O_3$— 3 | 2000 ppm | X | X | X | X |
| | 9 | 96.4 | $Er_2O_3$— 3 | 500 ppm | X | X | X | X |
| | 10 | 91.5 | $Y_2O_3$— 8 | 500 ppm | X | X | X | X |
| | 11 | 91.2 | $Y_2O_3$— 8 | 2000 ppm | X | X | X | X |

TABLE 2-continued

| No. | AlN (wt %) | Sintering aid (wt %) | Time Si | 100 hrs | 200 hrs | 400 hrs | 800 hrs |
| --- | --- | --- | --- | --- | --- | --- | --- |

○: The number of particles having a diameter of 0.3 μm or less is less than 15.
X: The number of particles having a diameter of 0.3 μm or less is 15 or more.

As shown in Table 2, in samples 7 to 11, since the content of AlN was less than 99 wt %, the number of particles having a diameter of 0.3 μm or more was 15 or more after the etching process was conducted for 100 hours. In sample 6, since the content of silicon was excessive, 2000 ppm, although no sintering aid was included, the number of particles having a diameter of 0.3 μm or more was 15 or more after the etching process was conducted for 100 hours, just as samples 7 to 11.

However, in samples 1 to 5 in accordance with the third invention, since the content of AlN was 99 wt % or more and the content of silicon was 1500 ppm or less, the number of particles having a diameter of 0.3 um or more was able to be reduced to less than 15 after the etching process was conducted for 400 hours. Accordingly, the samples were able to fully conform to the standard, In particular, in samples 1 and 2, since the content of silicon was 500 ppm or less, the number of particles having a diameter of 0.3 um or more was less than 15 even after the etching process was conducted for 800 hours.

Figure 11:
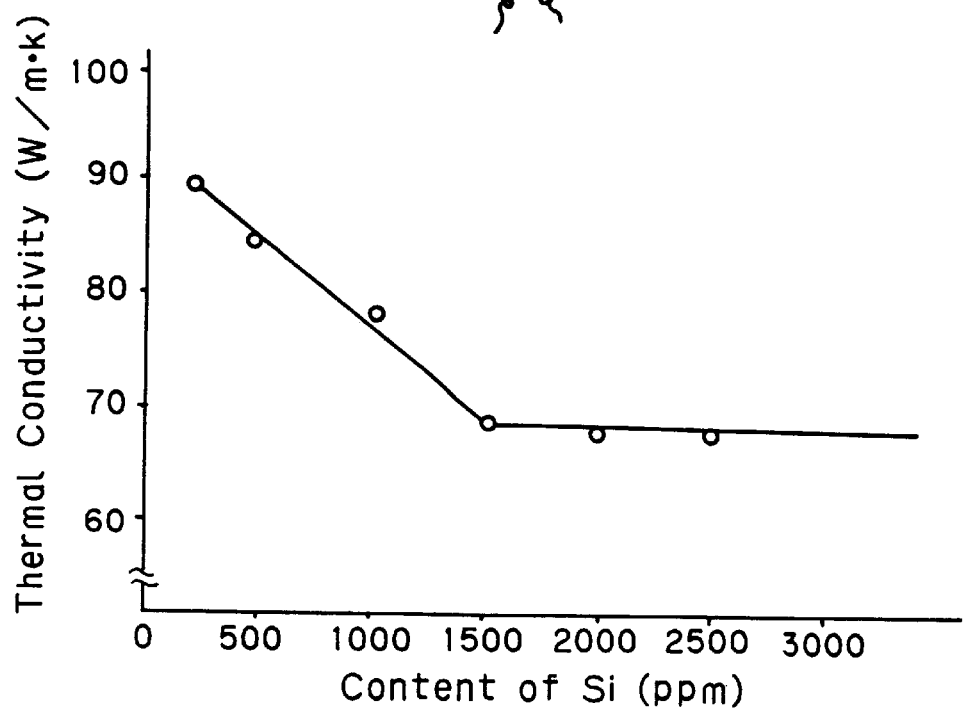
FIG. 11 is a graph showing the relationship between the content of silicon and the thermal conductivity of the aluminum nitride based sintered body in accordance with the third invention.

On the other hand, the thermal conductivity values of aluminum nitride based sintered bodies containing no sintering aid were measured while the content of silicon was changed. The results are shown in FIG. 11. According to this graph, the thermal conductivity decreases quickly as the content of silicon increases to 1500 ppm. However, the thermal conductivity hardly decreases as the content of silicon increases further. It is thus found that a thermal conductivity value of 65 W/m.k or more can be obtained when the content of silicon is 1500 ppm or less, and that a thermal conductivity value of 70 W/m.k or more can be obtained when the content of silicon is 1000 ppm or less.

As described above, since the wafer holding member in accordance with the third invention is made of an aluminum nitride based sintered body containing 99 wt % or more of AlN and 1500 ppm or less of silicon, the wafer holding member is hardly etched by halogenic corrosive gases and superior in corrosion resistant.

Furthermore, in the third invention, since at least the mounting surface for holding a wafer, such as a semiconductor wafer or a glass substrate wafer for liquid crystal display, is made of an aluminum nitride based sintered body containing 99 wt % or more of AlN and 1500 ppm or less of silicon, aluminum nitride particles are hardly separated, even when the wafer holding means having the mounting surface is exposed to a plasma-generated halogenic corrosive gas. Moreover, since the mounting surface is made of a high-purity aluminum nitride based sintered body and thus hardly includes impurities, a wafer, such as a semiconductor wafer or a glass substrate wafer for liquid crystal display, is not contaminated or adversely affected by dielectric breakdown. Consequently, the wafer holding member having a long service life can be obtained. In addition, because of its high thermal conductivity, the wafer holding member can heat such a wafer in a short period of time. The aluminum nitride based sintered body in accordance with the third invention can be applied to not only the wafer holding member but also various members required to be corrosion-resistant in a halogenic corrosive gas atmosphere.

What is claimed is:

1. A wafer holding member comprising:
    a base body made of an aluminum nitride based sintered body containing 99 wt % or more of AlN and 1500 ppm or less by weight of Si, and
    a heating resistor embedded in the base body, said heating resistor being made of a mixture containing 90 to 99 wt % of at least one of W, Mo, WC, TiC and TiN, and 1 to 10 wt % of AlN.

2. The wafer holding member of claim 1, wherein said aluminum nitride based sintered body contains 2000 ppm or less by weight of a total amount of Na, Ca and Fe.

3. The wafer holding member of claim 1, wherein the aluminum nitride based sintered body contains 99.5 wt % or more of AlN.

4. The wafer holding member of claim 1, wherein the aluminum nitride based sintered body contains 99.8 wt % or more of AlN.

5. The wafer holding member of claim 4, wherein the resistor contains between 4–7 wt % AlN.

6. The wafer holding member of claim 1, wherein the resistor contains between 4–7 wt % AlN.

7. The wafer holding member of claim 1, wherein the aluminum nitride based sintered body contains 1000 ppm or less of silicon.

8. The wafer holding member of claim 1, wherein the thermal conductivity of the sintered body is 65 W/m.k or greater.

9. A wafer holding member comprising:
    a base body made of an aluminum nitride based sintered body containing 99 wt % or more of AlN and 1500 ppm or less by weight of Si, and
    an electrostatic adhesion electrode embedded in the base body, said electrostatic adhesion electrode being made of a mixture containing 50 to 99 wt % of at least one of W, Mo, WC, TiC and TiN, and 1 to 50 wt % of AlN.

10. The wafer holding member of claim 9, wherein said aluminum nitride based sintered body contains 2000 ppm or less by weight of a total amount of Na, Ca and Fe.

11. The wafer holding member of claim 9, wherein the aluminum nitride based sintered body contains 1000 ppm or less of silicon.

12. The wafer holding member of claim 9, wherein the aluminum nitride based sintered body contains 99.5 wt % or more of AlN.

13. The wafer holding member of claim 9, wherein the aluminum nitride based sintered body contains 99.8 wt % or more of AlN.

14. The wafer holding member of claim 9, wherein the thermal conductivity of the sintered body is 65 W/m.k or greater.

15. A wafer holding member comprising:
    a base body made of an aluminum nitride based sintered body containing 99 wt % or more of AlN and 1500 ppm or less by weight of Si, and
    a plasma generation electrode embedded in the base body, said plasma generation electrode being made of a mixture containing 80 to 99 wt % of at least one of W, Mo, WC, TiC and TiN, and 1 to 20 wt % of AlN.

16. The wafer holding member of claim 15, wherein said aluminum nitride based sintered body contains 2000 ppm or less by weight of a total amount of Na, Ca and Fe.

17. The wafer holding member of claim 15, wherein the aluminum nitride based sintered body contains 1000 ppm or less of silicon.

18. The wafer holding member of claim 15, wherein the aluminum nitride based sintered body contains 99.5 wt % or more of AlN.

19. The wafer holding member of claim 15, wherein the aluminum nitride based sintered body contains 99.8 wt % or more of AlN.

20. The wafer holding member of claim 15, wherein the thermal conductivity of the sintered body is 65 W/m.k or greater.

* * * * *